United States Patent

Mian

[19]

[11] Patent Number: 6,025,712

[45] Date of Patent: *Feb. 15, 2000

[54] METHOD FOR CHARACTERIZING A READ HEAD BASED ON WRITE INDUCED MAGNETIC READ CENTER SHIFTS AND READ SENSITIVITY CHANGES IN THE READ HEAD

[75] Inventor: Guo Mian, Milpitas, Calif.

[73] Assignee: Samsung Electronics, Ltd., Rep. of Korea

[*] Notice: This patent is subject to a terminal disclaimer.

[21] Appl. No.: 09/252,720

[22] Filed: Feb. 19, 1999

Related U.S. Application Data

[63] Continuation of application No. 08/819,293, Mar. 18, 1997, Pat. No. 5,914,594.

[51] Int. Cl.⁷ .......................... G01R 33/12; G11B 27/36; G11B 5/09; G04C 13/04

[52] U.S. Cl. ...................... 324/210; 360/31; 369/53; 369/55

[58] Field of Search .................... 324/210, 211, 324/212; 360/31; 369/53, 55, 56, 57

[56] References Cited

U.S. PATENT DOCUMENTS 5,914,594   6/1999   Mian ........................................ 324/210

OTHER PUBLICATIONS

"Determining a Signal to Noise Ration for an Arbitrary Data Sequence by a Time Domain Analysis," by Guo Mian and Thomas D. Howell, Feb. 15, 1993, 3 pages.

"Micromagnetic transverse correlation length in thin film magnetic recording media, medium noise, and tracking," by Muo Mian, Ronald S. Indeck, Marcel W. Muller, *Journal of Magnetic and Magnetic Materials* 152(1996), revised Jun. 26, 1995, pp. 253–264.

"Effects of a Highly Permeable Keeper layer on Transition Shifts for Thin Film Media," by Guo Mian, Po–Kang Wang, *IEEE Transactions on Magnetics*, vol. 30, No. 6, Nov. 1994, pp. 3984–3986.

"Read Write Analyzer/Wite™ Windows ™ Integrated Test Environment—User's Guide," *Guzik Technical Enterprises*, pp. iii, 87–89.

"Write Induced Track Misregistration Due to Magnetic Center Shifts In Thin Film Inductive Heads," by Michael P. Salo et al., *IEEE Transactions on Magnetics*, vol. 30, No. 6, Nov. 1994, pp. 3882–3884.

"An Algorithm for a Real Time Measurement of Nonlinear Transition Shift by a Time Domain Correlation Analysis," by Guo Mian, *IEEE Transactions on Magnetic*, vol. 31, No. 1, Jan. 1995.

*Primary Examiner*—Walter E. Snow
*Attorney, Agent, or Firm*—Blakely, Sokoloff, Taylor & Zafman LLP

[57] ABSTRACT

The present invention relates to a method for characterizing a head in a hard drive assembly, in which the head has a write element. The method comprises providing a disk attached to a hard disk drive assembly, the disk having a plurality of tracks each having a track centerline. One of the tracks has a plurality of sectors. One of the sectors has a servo field with an A burst, a B burst and a C burst, where the A burst and the C bursts have a common boundary located at a track centerline and where the B burst has a center that is positioned along the track centerline. Each sector also has a data field. The read element is aligned with the B servo burst, and data is written in a data field of a first sector of one of the tracks. An A burst and a C burst located in a following sector of one of the tracks is read to provide an A burst amplitude value and a C burst amplitude value. A characteristic of the read element based on the A burst amplitude value and the C burst amplitude value is then determined.

9 Claims, 8 Drawing Sheets

METHOD FOR CHARACTERIZING A READ HEAD BASED ON WRITE INDUCED MAGNETIC READ CENTER SHIFTS AND READ SENSITIVITY CHANGES IN THE READ HEAD

This Appln. is a con't. of Ser. No. 08/819,293, Mar. 18, 1997 now U.S. Pat. No. 5,914,594.

BACKGROUND OF THE INVENTION

1. Field of the Invention

The present invention relates in general to disk storage systems and more particularly, to a method for characterizing a read head based on the correlation of write-induced magnetic read center shifts and read sensitivity changes in the read head.

2. Description of the Related Art

Disk drives are magnetic recording devices used for the storage of information. The information is recorded on concentric tracks on either surface of one or more magnetic recording disks. The disks are rotatably mounted to a spin motor and information is accessed by means of read/write heads that are mounted to actuator arms which are rotated by a voice coil motor. The voice coil motor is excited with a current to rotate the actuator and move the heads. The read/write heads must be accurately aligned with the storage tracks on the disk to ensure proper reading and writing of information.

Dual element transducers are being increasingly utilized in hard disk drives because they have greater aerial densities than single element transducers. Dual element transducers include a single inductive write element and a separate read element which is constructed from a magneto-resistive material. Such dual element transducers are commonly referred to as magneto-resistive (MR) heads.

The magnetic material in the read or write element of an MR head is generally characterized by a relative permeability $\mu$, where $\mu\mu_0 = B/H$, $\mu_0$ being the magnetic constant ($4\pi \times 10^{-7}$), B being the magnetic field and H being the magnetic field intensity. However, magnetic materials are composed of individual domains with local magnetizations equal to the saturation magnetization of the material. When a head is used for writing or reading, the rotation of magnetization within these domains, or the shift of domain walls, constitutes the head response to magnetic fields.

Where there are multiple domain configurations in the head, the domain configuration in an MR read element can be reset from one state to other states by a write field excitation provided by a write element of the MR head. Such changes in the domain configuration of an MR read element often results in changes in readback characteristics of the head, for example, the amplitude, pulse width and shape, as well as the amplitude asymmetry of the readback signal. It has also been observed that the read center for an unstable MR head shifted frequently and randomly from its original position to different positions after write operations. Similarly, when a gated write excitation is applied to an unstable inductive head, its magnetic read center also shifts. Such magnetic read center shifts can cause track misregistration in disk drives. The problem is compounded in disk drives with high storage density. It is thus important to accurately characterize and determine the instability of read heads.

One current technique of characterizing instability of read heads is the use of a coefficient of variance of the track average amplitude (TAA), COV(TAA), which is expressed as follows:

$$COV(TAA) = \sigma(TAA)/Avg(TAA) \times 100\%$$

where $\sigma(TAA)$ is the standard deviation of the TAA and Avg(TAA) is the average value of the TAA, where each TAA is measured after a write excitation.

However, several factors attributing to the instability are not considered in the above approach. Changes in readback amplitudes for the MR head are due to the combined effects of the read sensitivity change and the magnetic read center shift of the head. FIG. 1 illustrates the standard deviation of the magnetic read center shift under gated write excitations vs. COV(TAA) for a group of MR heads. The average write and read widths for these heads were 3.3 $\mu$m and 2.5 $\mu$m, respectively. As shown in FIG. 1, the correlation between COV(TAA) and the standard deviation of the read center shifts, $\sigma$(shifts), is quite poor. Thus, the use of COV(TAA) to determine the instability of read heads, as well as its use to determine write-induced track misregistration for disk drives is inaccurate and can be misleading.

Accordingly, there is a need in the technology for a simple and accurate method for characterizing a read head based on write-induced magnetic read center shifts and read sensitivity changes in the read head, which will facilitate reduction of track misregistration, as well as the classification and qualification of read heads.

BRIEF SUMMARY OF THE INVENTION

The present invention relates to a method for characterizing a head in a hard drive assembly, in which the head has a write element. The method comprises providing a disk attached to a hard disk drive assembly, the disk having a plurality of tracks each having a track centerline. One of the tracks has a plurality of sectors. One of the sectors has a servo field with an A burst, a B burst and a C burst, where the A burst and the C bursts have a common boundary located at a track centerline and where the B burst has a center that is positioned along the track centerline. Each sector also has a data field. The read element is aligned with the B servo burst, and data is written in a data field of a first sector of one of the tracks. An A burst and a C burst located in a following sector of one of the tracks is read to provide an A burst amplitude value and a C burst amplitude value. A characteristic of the read element based on the A burst amplitude value and the C burst amplitude value is then determined.

DETAILED DESCRIPTION OF THE INVENTION

The present invention relates to a method of characterizing a read head. The technique of the present invention provides a correlation function which accurately describes the instability of the read head based on magnetic read center shifts and read head sensitivity changes.

A. Principles of Operation

I. Magnetic Read Center Shift

Figure 2A:
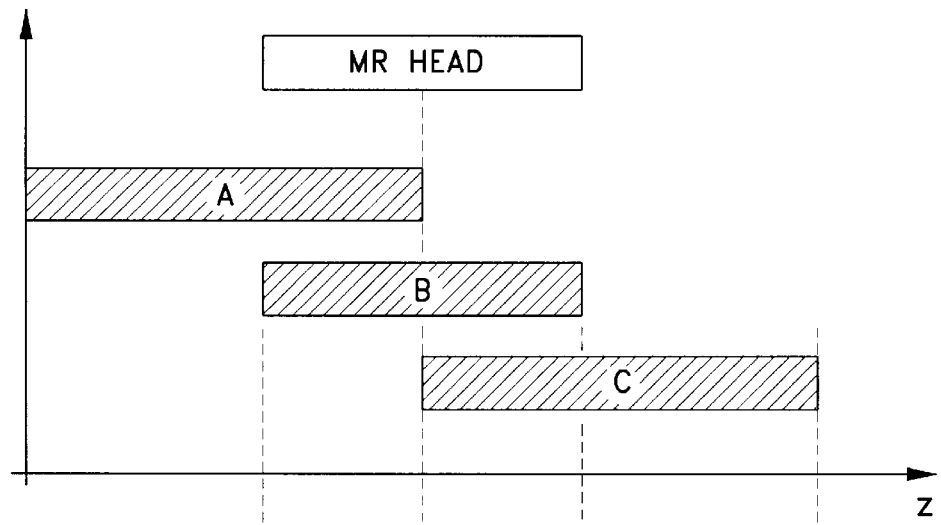
FIG. 2A illustrates three servo bursts A, B and C that are written on a track of a disk at a single frequency.
Figure 2B:
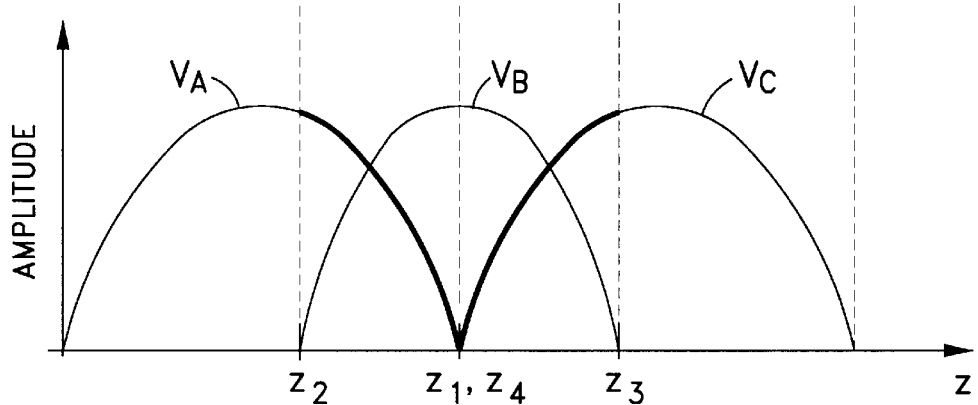
FIG. 2B is a graph illustrating the variation of the servo burst amplitude values $V_A$, $V_B$ and $V_C$, of servo bursts A, B and C of FIG. 2A respectively, with respect to the position of the read head of a disk drive.

An expression for determining the MR read center shift more precisely will now be derived and described. FIG. 2A illustrates three servo bursts A, B and C that are written on a track of a disk at a single frequency. The servo bursts A, B and C are identical but offset in phase. In one embodiment, the B burst is centered along the centerline of the track, while the A and C bursts have a common boundary at the track centerline. The B burst is located between the A and C bursts. FIG. 2B is a graph illustrating the variation of the servo burst amplitude values $V_A$, $V_B$ and $V_C$ of servo bursts A, B and C of FIG. 2A respectively, with respect to the position of the read head of a disk drive. Since A, B and C are identical but offset in phase, a single off track profile may be used to represent each $V_A$, $V_B$ and $V_C$, as shown in FIG. 2C.

Co-pending U.S. Application entitled "Method and Apparatus for Determining Write-Induced Magnetic Center Shifts in a Read Head" filed Mar. 18, 1997, and assigned to the assignee of the present invention, provides a complete discussion on the determination of magnetic read center shifts in a read head. The subject matter of this co-pending U.S. Application is incorporated herein by reference.

The expression for determining the MR read center shift is based on $V_A$, $V_B$ and $V_C$, and utilizes $V_B$ to compensate for the read sensitivity change.

Figure 2C:
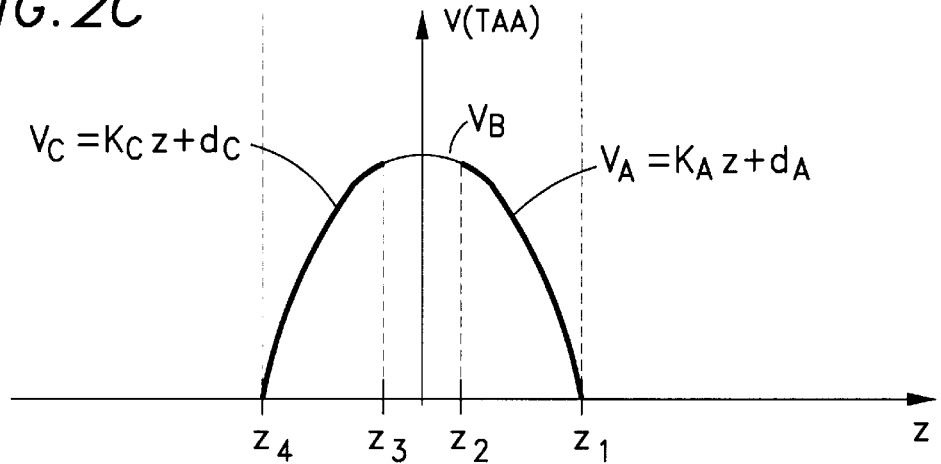
FIG. 2C illustrates a single, burst amplitude profile representative of the three servo bursts A, B and C of FIG. 2B with respect to the position of the read head of a disk drive.

Considering the off-track profile shown in FIG. 2C, let $V_{Xn}$ be the readback amplitude from the X burst at the nth reading. Thus, $$V_{An} - V_{Cn} = (K_{An} - K_{Cn})Z_n + d_{An} - d_{Cn} \quad (1)$$

where $Z_n$ is the read center position for the head at the nth reading; K and d are the slope and the constant, respectively, for linear fittings describing the off-track profile at the nth reading.

For an initial state, n=0, the following expression is obtained:

$$V_{A0} - V_{C0} = (K_{A0} - K_{C0})Z_0 + d_{A0} - d_{C0} \quad (2)$$

Assuming that changes in the read width for the MR head are very small under the write excitations, then $Z_{1n} - Z_{4n}$ and $Z_{2n} - Z_{3n}$ are constants. Thus, only K and d change as $V_B$ changes. As a result, the following expressions may be obtained:

$$d_{An} = d_{A0} V_{Bn}/V_{B0} \quad (3)$$

$$d_{Cn} = d_{C0} V_{Bn}/V_{B0} \quad (4)$$

$$K_{An} = K_{A0} V_{Bn}/V_{B0} \quad (5)$$

$$K_{Cn} = K_{C0} V_{Bn}/V_{B0} \quad (6)$$

Substituting Eqs. (3), (4), (5) and (6) into Eq. (1), the following expression is obtained.

$$V_{An} - V_{Cn} = V_{Bn}/V_{B0}[(K_{A0} - K_{C0})Z_n + (d_{A0} - d_{C0})] \quad (7)$$

Solving $Z_n$ and $Z_0$ from Eqs. (2) and (7), the shift of the magnetic read center from the initial reading n=0 to the mth reading n=m, $\delta Z(0 \rightarrow m) = Z_m - Z_0$, can be expressed as follows:

$$\delta Z(0 \rightarrow m) = [V_{B0}/V_{Bm}(V_{Am} - V_{Cm}) - (V_{A0} - V_{C0})]/(K_{A0} - K_{C0}) \quad (8)$$

Eq. (8) provides the magnetic read center shift by compensating for the effect of the read sensitivity change or the instability for MR heads. Since Eq. (8) only calculates the read center change, the initial read center location is not critical as long as $V_{Bm}$ is the maximum value for the off-track profile at the mth reading. However, in most cases for a reasonably good MR head, the corresponding profile of the B burst near the center of the burst is fairly constant, so that if the read head is approximately aligned with the center of the B burst, the value of $V_{Bm}$ near the center of the burst is approximately the maximum value. Therefore, one could still obtain reasonably accurate results even if the B burst written slightly off the center with respect to the common boundary of the A and C bursts. As a result, the implementation of Eq. (8) is also simple.

Figure 3:
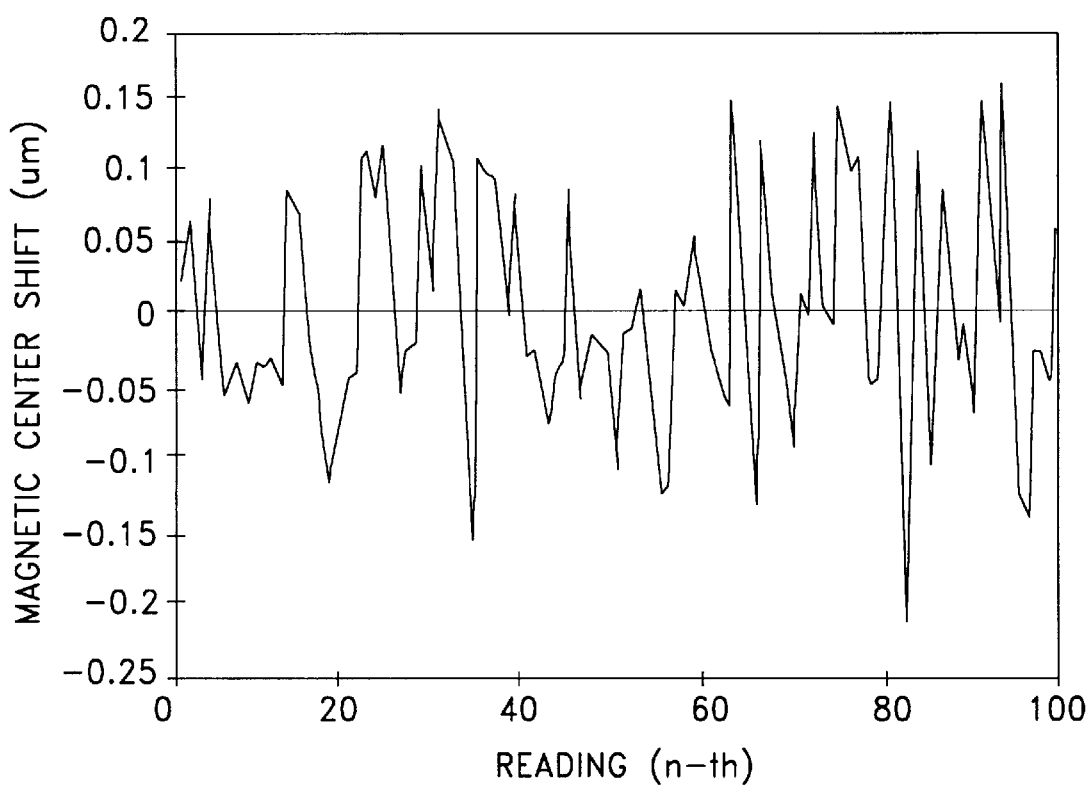
FIG. 3 is a graph illustrating the magnetic read center shift for an MR head, where each measurement is obtained after a write excitation.

FIG. 3 is a graph of the magnetic center shifts for an MR head based on measurements taken utilizing the technique provided in co-pending U.S. Application entitled "Method and Apparatus for determining Magnetic Read Center Shifts in a Read Head." In particular, the measurements are taken utilizing Eq. (8). As shown, the magnetic read center of the head changed randomly and frequently under gated write excitation. The normalized read center shift for each MR head is defined by σ(read center shifts head)/(read width of the head) in terms of percentage.

Since the correlation between COV(TAA) and c(shifts) is quite poor, the present invention provides a correlation function which accurately describes the instability of a read head based on the magnetic read center shift.

II. A Correlation Analysis

If two variables have a linear relationship, the correlation coefficient between the two variables will be unity.

A. Cross-Correlation Coefficients of $V_{An}$ and $V_{Cn}$

The change in the amplitude of the readback signals for unstable heads results from two-physical phenomena: the read element sensitivity changes and the magnetic read element center changes.

Two extreme cases for the instability will now be considered. First, the instability of an MR head caused only by changes in the read sensitivity of the head (without considering shifting of the magnetic read center) will be considered. Thus, $V_{An}$ and $V_{Cn}$ will be increased or decreased as $V_{Bn}$ increases or decreases. As a result, the change in $V_{An}$ and $V_{Cn}$, $\delta V_{An}$ and $\delta V_{Cn}$ respectively, may be expressed as follows:

$$\delta V_{An} = V_{An} - V_{A0}$$

$$\delta V_{Cn} = V_{Cn} - V_{C0}$$

For a symmetric off-track profile, $$K_{An} = -K_{Cn}$$

$$\delta V_{An} = -\delta V_{Cn}$$

For an asymmetric off-track profile:

$$\delta V_{An} \alpha \delta V_{Cn}$$

$$V_{An} \alpha V_{Cn}$$

Therefore, in this case, a cross-correlation coefficient of $\{V_{An}\}$ and $\{V_{Cn}\}$, $r(V_A, V_C)$, equals to a positive unity, and can be expressed as follows:

$$r(V_A, V_C) = 1 \quad (9)$$

Thus, the instability of a head resulting purely from changes in the read sensitivity of the head provides a cross-correlation coefficient of positive unity.

Next, the instability of an MR head caused only by changes in the magnetic read center shifts (without considering any changes in read sensitivity) is considered. Thus, $V_{Bn} = V_{B0} = \text{const}$. $V_{An}$ increases or decreases as $V_{Cn}$ decreases or increases.

For the symmetric off-track profile:

$$K_{An} = -K_{Cn}$$

$$\delta V_{An} = -\delta V_{Cn}$$

For the asymmetric off-track profile:

$$\delta V_{An} \alpha - \delta V_{Cn}$$

$$V_{An} \alpha - V_{Cn}$$

Therefore, for this case, the cross correlation coefficient of $\{V_{An}\}$ and $\{V_{Cn}\}$, $r\{V_A, V_C\}$, equals to a negative unity, that is:

$$r(V_A, V_C) = -1 \quad (10)$$

Thus, the instability of a head resulting purely from changes in the magnetic read center shifts of the head provides a cross-correlation coefficient of negative unity.

B. Correlation Function Describing Magnetic Read Center Shifts

Based on the above analysis, the write-induced magnetic read center shift for MR heads may then be characterized based on the combined factors of COV(TAA) (or COV (amplitude), i.e., $COV(V_A)$ and $COV(V_C)$ and the cross correlation of $V_A$ and $V_C$, i.e., $r(V_A, V_C)$. By including both the cross correlation and COV(amplitude), the following correlation function is obtained:

$$M(V_A, V_C) = [1 - r(V_A, V_C)]\{[COV(V_A) + COV(V_C)]/2\}^2 / 100 \quad (12)$$

where $$r(V_A, V_C) = \frac{\text{Covariance}(V_A, V_C)}{\sigma(V_A)\sigma(V_C)} \quad (13)$$

$$= \frac{\frac{1}{N}\sum_{i,j}^{N} V_{Ai}V_{Cj} - \frac{1}{N^2}\sum_{i}^{N} V_{Ai}\sum_{j}^{N} V_{Cj}}{\sqrt{\left[\frac{1}{N}\sum_{i}^{N} V_{Ai}^2 - \left(\frac{1}{N}\sum_{i}^{N} V_A\right)^2\right]\left[\frac{1}{N}\sum_{j}^{N} V_{Cj}^2 - \left(\frac{1}{N}\sum_{j}^{N} V_{Cj}\right)^2\right]}};$$

$$COV(V_A) = \left(\frac{\sigma(V_A)}{\text{Avg}(V_A)}\right) \times 100 \quad (14)$$

$$= \left(\frac{\sqrt{\frac{1}{N}\sum_{i}^{N} V_{Ai}^2 - \left(\frac{1}{N}\sum_{i}^{N} V_{Ai}\right)^2}}{\frac{1}{N}\sum_{i}^{N} V_{Ai}}\right) \times 100;$$

$$COV(V_C) = \left(\frac{\sigma(V_C)}{\text{Avg}(V_C)}\right) \times 100 \quad (15)$$

$$= \left(\frac{\sqrt{\frac{1}{N}\sum_{j}^{N} V_{Cj}^2 - \left(\frac{1}{N}\sum_{j}^{N} V_{Cj}\right)^2}}{\frac{1}{N}\sum_{j}^{N} V_{Cj}}\right) \times 100;$$

N, i and j are integers. In one embodiment, i=j. In another embodiment, N=100.

If there is no shift in the magnetic read center, then $r(V_A, V_C) = 1$, and the $M(V_A, V_C)$ function equals to zero. If the instability results purely from the shift of the magnetic read center, then $r(V_A, V_C) = -1$, and the $M(V_A, V_C)$ function reaches a maximum value. In Eq. (12), $COV(V_A)$ and $COV(V_C)$ were utilized to scale $M(V_A, V_C)$.

B. Application

Figure 5:
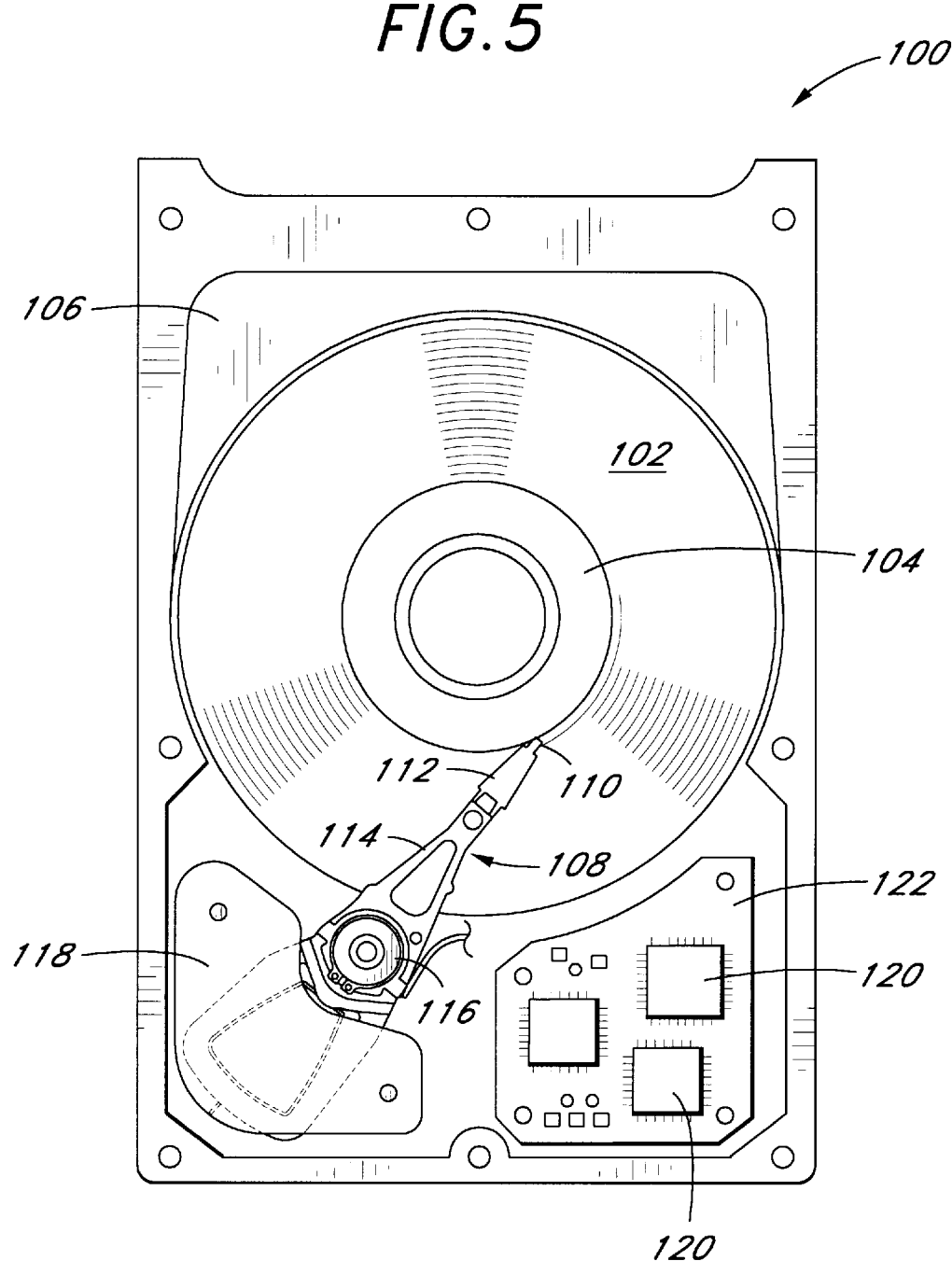
FIG. 5 illustrates a hard disk drive which utilizes the method of the present invention.

Referring to the drawings more particularly by reference numbers, FIG. 5 illustrates a hard disk drive 10 which implements the apparatus and method of the present invention. The disk drive 10 includes a disk pack 100 with a plurality of disks 102 that are collectively rotated by a spin motor 104. The spin motor 104 is mounted to a base plate 106. Also mounted to the base plate 106 is an actuator arm assembly 108. The actuator arm assembly 108 includes a number of read/write (R/W) heads 110a–d mounted to corresponding flexure arms 112. The flexure arms 112 are attached to an actuator arm 114 that can rotate about a bearing assembly 116. The assembly 108 also contains a voice coil motor 118 which moves the heads 110a–d collectively relative to the disks 102. There is typically a single head for each disk surface. The spin motor 104, voice coil 118 and the heads 110 are coupled to a number of electronic circuits 120 mounted to a printed circuit board 122. In the following discussion, only one head 110 is referenced. The electronic circuits 120 typically include a read channel circuit, a microprocessor-based controller and a random access memory (RAM) device.

Figure 6:
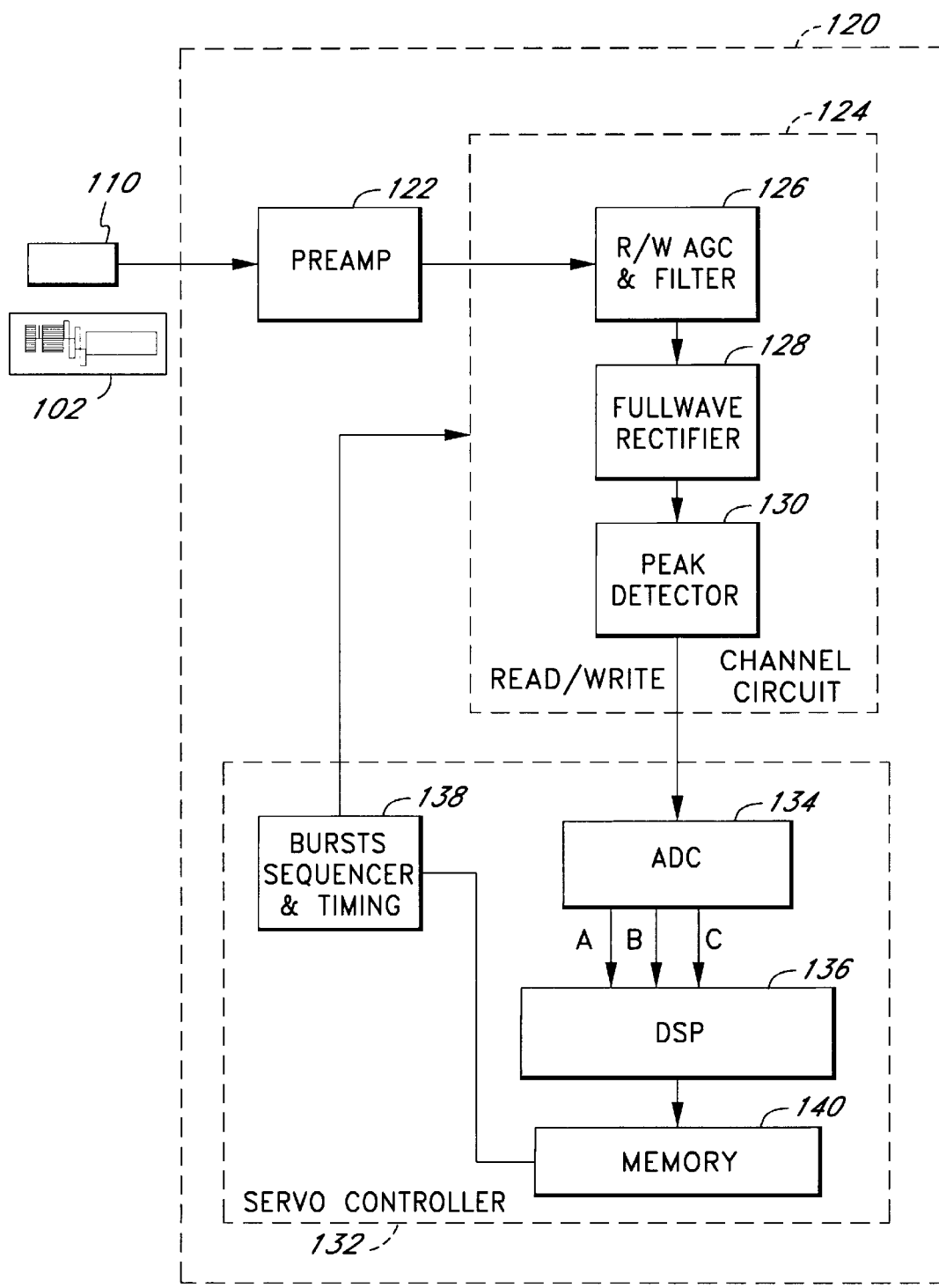
FIG. 6 is a block diagram of portions of an integrated circuit read channel in accordance with the present invention.

FIG. 6 is a block diagram of an electronic circuit 120 of the drive. The electronic circuit 120 includes a preamplifier 122 which is coupled to a read/write (R/W) channel circuit 124. The R/W channel circuit 124 includes a R/W Automatic Gain Control (AGC), a filter circuit 126, a fullwave rectifier 128 and a peak detector 130. The electronic circuit 120 further comprises a microprocessor-based servo controller 132 which includes an analog-to-digital converter (ADC)

134, a digital signal processor (DSP) 136, a burst sequencer and timing circuit 138 and a memory 140, such as a random access memory (RAM) device.

The electronic circuit 120 is coupled to one of the magnetic heads 110 which senses the magnetic field of a magnetic disk 102. When reading the servo information located in the servo field region 10 on the disk 102, the head 110 generates a read signal that corresponds to the magnetic field of the disk 102. The read signal is first amplified by the preamplifier 122, and then provided to the R/W channel circuit 124. The AGC data included in the read signal is provided to the R/W AGC and filter circuit 126. The R/W AGC circuit in circuit 126 monitors the AGC data provided by the read signal and the read signal is then filtered by the filter circuit located in the R/W AGC and filter circuit 126. The fullwave rectifier 128 rectifies the read signal and provides the rectified read signal to the peak detector 130. The peak detector 130 detects the amplitude of the read signal. The read signal is then provided to the ADC 134 which provides digitized samples of the analog read signal. The digitized signal is then provided to a digital signal processor (DSP) 136 which first reconstructs the burst amplitude values corresponding to the readings of the A, B and C bursts. Based on the readings of the servo bursts A, B and C, the DSP 136 can determine the write-induced magnetic center shift for the read head.

Figure 7:
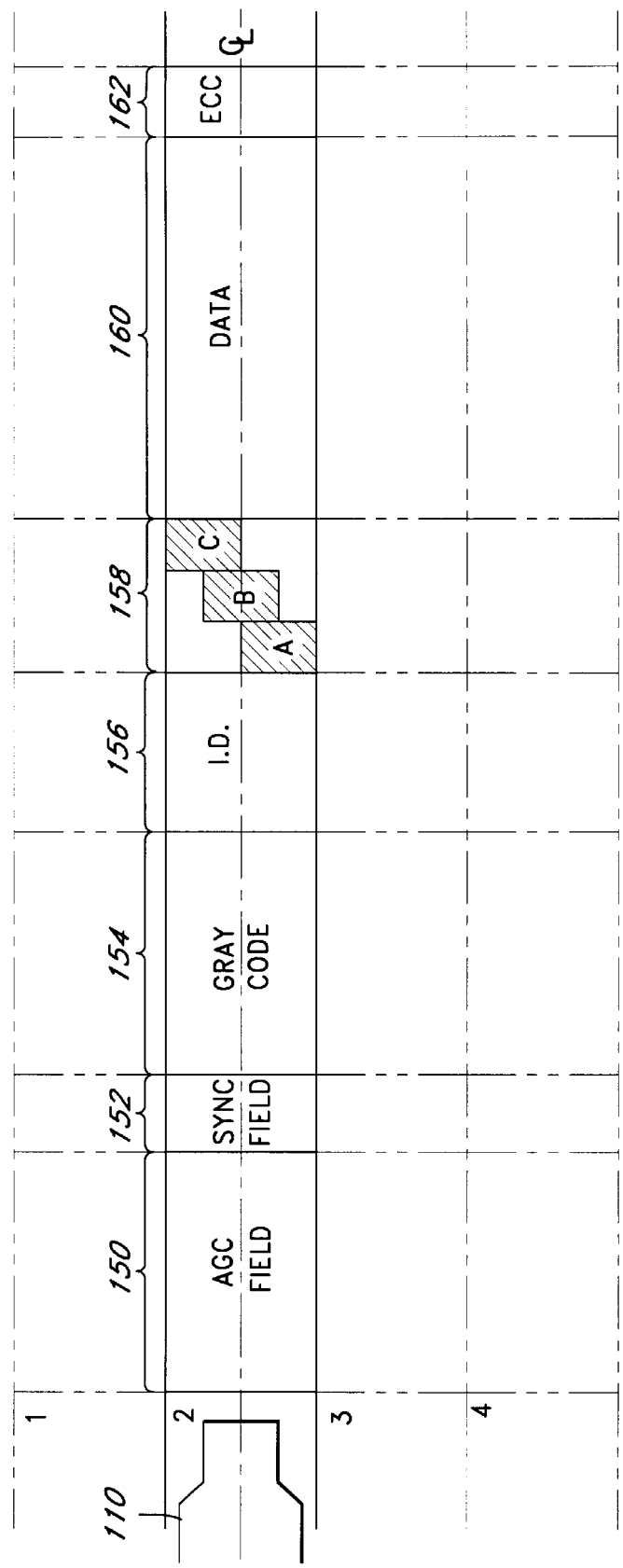
FIG. 7 illustrates the layout of a sector in a track in accordance with the principles of the present invention.

FIG. 7 illustrates the layout of a sector in a track in accordance with the principles of the present invention. Data is stored within sectors of radially concentric tracks located across the disk 102. In accordance with the principles of the present invention, a sector within a track will have an automatic gain control (AGC) field 150, a synchronization (sync) field 152, a gray code field 154 that identifies the track, an identification (ID) field 156 that defines the sector, a servo field 158 which includes a number of servo bursts A, B and C, a data field 160 which contains the data and an error correction code field 162. The servo bursts A, B and C may be written on a track of the disk 102 using a spinstand, a head-media tester or a servo writer, as known in the art. In one preferred embodiment, the servo bursts A, B and C are identical, but offset in phase so that the A burst and the C burst have a common boundary located at the track centerline and where the centerline of the B burst is coincident with the track centerline.

Once the servo bursts A, B and C have been written, testing of one or more heads may begin. To determine the instability based on the read center shift in a R/W head 110, the R/W head 110 is first aligned with the center of the B burst. A predetermined number of measurements of $V_A$ and $V_C$ are then obtained, each of which is taken after a write excitation field has been applied to the R/W head 110. Based on the measurements, $r(V_A, V_C)$, $COV(V_A)$ and $COV(V_C)$ are calculated based on Eq. (13), (14) and (15) respectively. Next, the correlation function $M(V_A, V_C)$ is calculated based on $r(V_A, V_C)$, $COV(V_A)$ and $COV(V_C)$, as provided in Eq. (12). The results are then stored.

Figure 8:
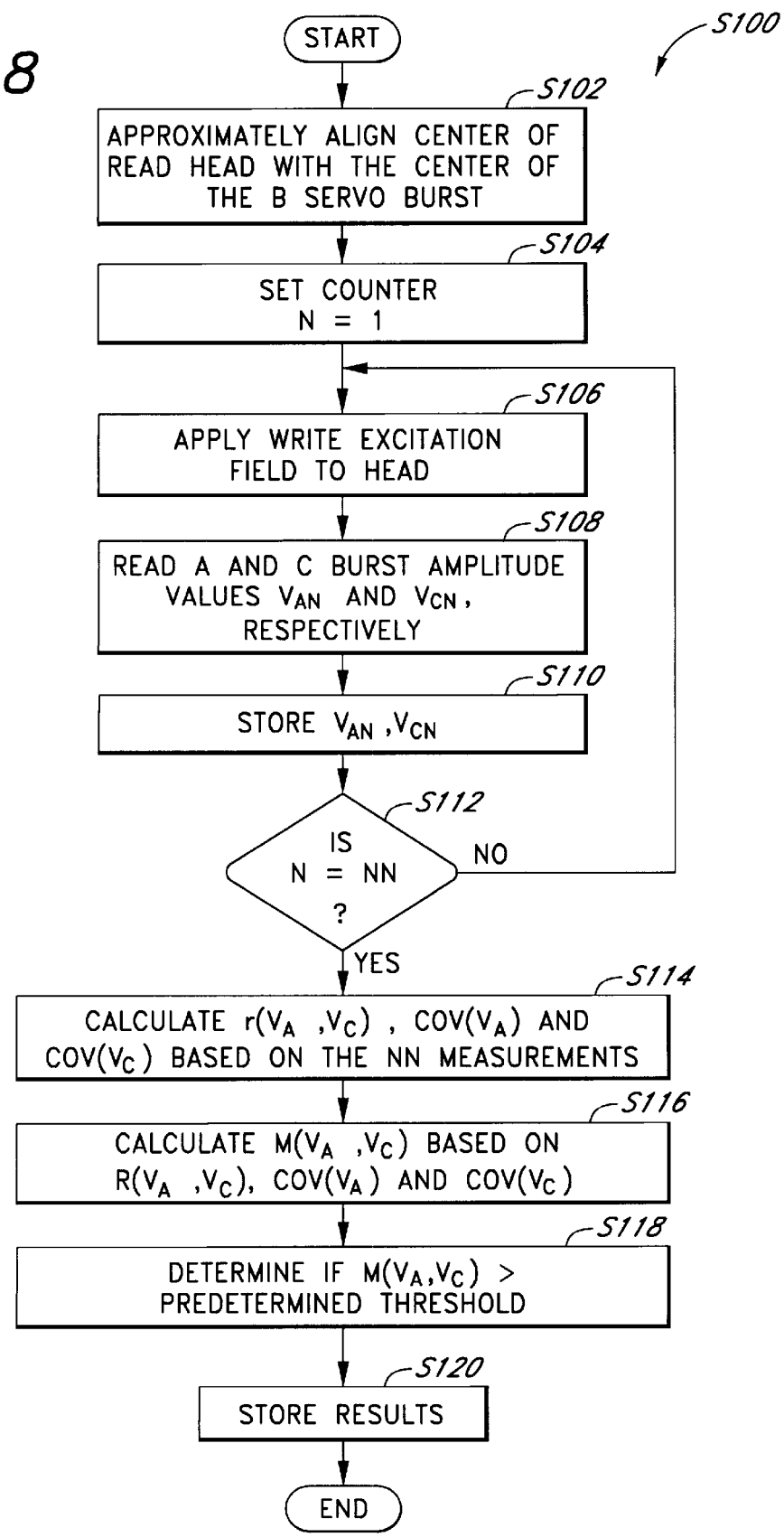
FIG. 8 is a flowchart that illustrates one embodiment of correlation determination process provided in accordance with the principles of the present invention.

FIG. 8 is a flowchart that illustrates one embodiment of the correlation determination process in accordance with the principles of the present invention. Beginning from a start state, the process S100 proceeds to process step S102, where the R/W head 110 is approximately aligned with the center of the B servo burst. The process S100 then proceeds to process step S104, where the counter N, for maintaining a count of the measurements taken is set to 1. The process S100 then proceeds to process step S106, where a write excitation field is applied to the R/W head 110. In particular, the R/W head 110 is directed to write in the data field 160 of a first sector. The process S100 then proceeds to process step S108, where it directs the R/W head 110 to proceed to the servo field of the next sector to read the A and C burst amplitude values $V_{AN}$, and $V_{CN}$. In this initial case, N=1, so that $V_{AN}=V_{A1}$ and $V_{CN}=V_{C1}$. The values of $V_{AN}$, and $V_{CN}$ are then stored, as shown in process step S110.

The process S100 then advances to decision step S112, where it determines if it has reached the predetermined number of measurements, NN. In one embodiment, NN is 100. It is apparent to one of ordinary skill in the technology that NN may be greater or less than 100, and may be selected according to accuracy requirements or according to specification. If the predetermined number of measurements NN has not been reached, the process proceeds to returns to process step S106, where it applies a write excitation field to the R/W head 110. The process S100 then proceeds to take another reading of the A and C burst amplitude values $V_{AN}$, and $V_{CN}$. If, at decision step S112, the predetermined number of measurements NN has been reached, the process proceeds to process step S114, where it calculates $r(V_A, V_C)$, $COV(V_A)$ and $COV(V_C)$ based on the NN measurements taken. Next, the process S100 proceeds to process step S114, where it calculates $M(V_A, V_C)$ based on $r(V_A, V_C)$, $COV(V_A)$ and $COV(V_C)$. The process S100 then proceeds to process step S118, where it determines if $M(V_A, V_C)$ is larger than a predetermined threshold. In one embodiment, if $M(V_A, V_C)$ is larger than the predetermined threshold, the R/W head 110 is accepted as a qualified head. Otherwise, the R/W head 110 is rejected. The value of $M(V_A, V_C)$ will correspond to the standard deviation of the magnetic center shift determined by the overall track misregistration budget. Accordingly, the predetermined threshold is a limit set by the standard deviation. The results are then stored, as shown in process step S120 and the process S100 terminates.

It should be noted that the process S100 may be implemented for MR heads or inductive heads to determine the write-induced magnetic center shifts of the heads. In addition, the process S100 may be repeated for any number of heads. Moreover, the process S100 may be implemented at the disk drive 100 level or at the servo writer level.

C. Experimental Results

Figure 1:
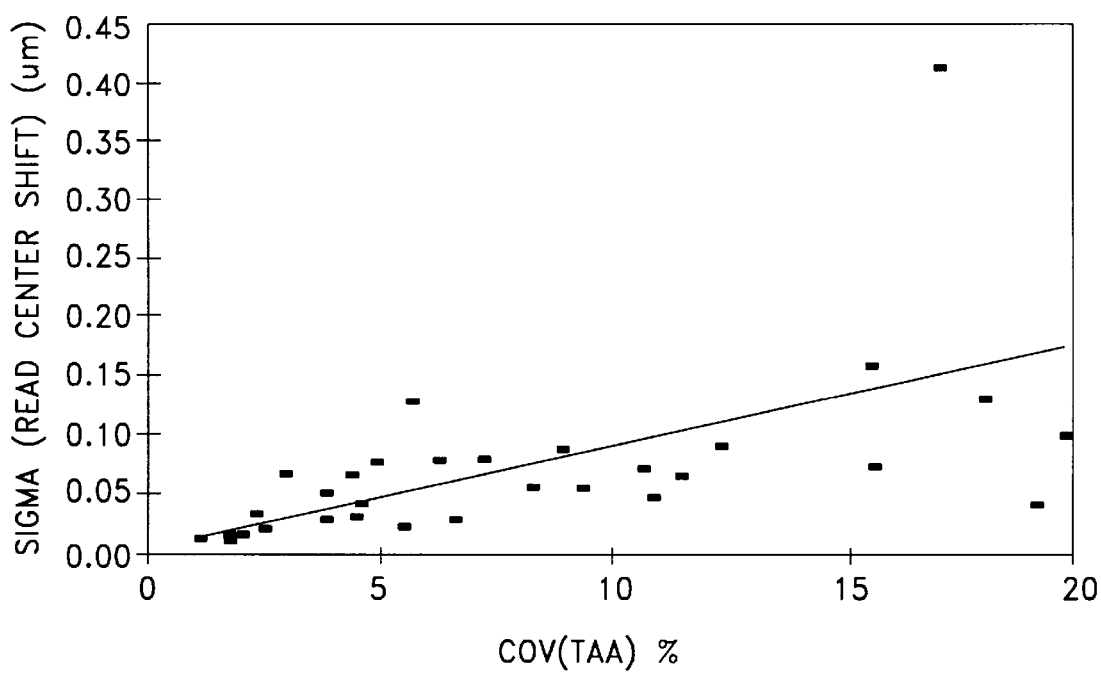
FIG. 1 is a graph illustrating the variation of $\sigma$, the standard deviation of the read center shift with respect to COV(TAA), the covariance of the track average amplitude, as provided using a prior art technique.
Figure 4:
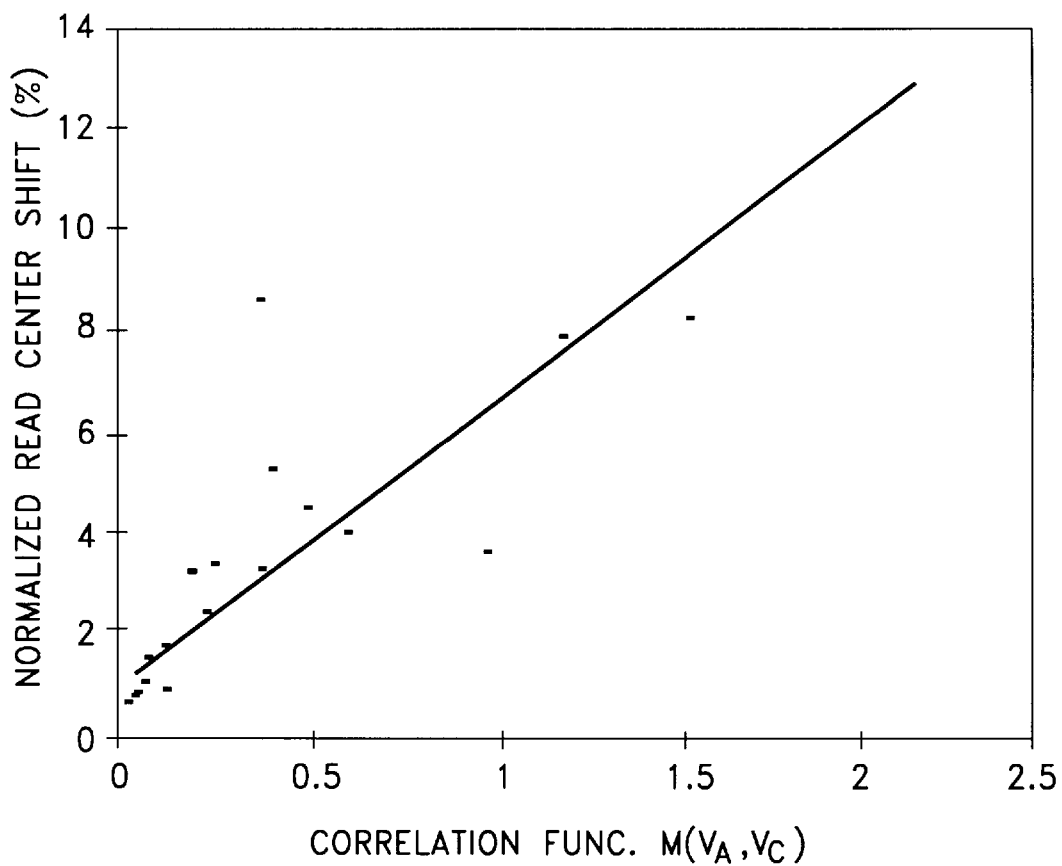
FIG. 4 is a graph illustrating the normalized read center shift of a read head based on the correlation function provided in accordance with the principles of the present invention.

To verify the effectiveness for the expressions in Eq. (8) and in Eq. (12), a group of MR heads with different coefficients of variances, COV, were tested. The results are shown in FIG. 4. Comparing with FIG. 1 with FIG. 4, it can be observed that the write-induced magnetic read center shift for MR heads may be more accurately characterized by using the technique of the present invention (through the application of Eq. (12)) than by utilizing the coefficient of variance, COV. It should be noted that the correlation function $M(V_A, V_C)$ is not a unique function for describing the shift of the magnetic center. A different function adapting the above functions and techniques which involves COV (TAA) and the cross correlation of $V_A$ and $V_C$ or $\delta V_A$ and $\delta V_C$ will also correlate well with the shift of the magnetic read center.

It was found experimentally that $\delta V_{An} \alpha \delta V_{Cn}$ and $\delta V_{Ak} \alpha \delta V_{Ck}$ almost always co-existed. This indicated that the instability indeed was combined effect of the changes in the read sensitivity and the shifts in the magnetic read center. To minimize the effect of the instability on track misregistration, the cross-correlation close to positive unity is always preferred. If the coefficient is lower than 0.5, the contribution from the shift of the magnetic read center to the instability could be significant. Where the cross correlation coefficient is zero, the contribution to the instability from changes in read sensitivity and the shifts of the read center are equal. It should be noted that the functions and techniques developed herein may be applied not only to MR heads, but also to inductive heads. These functions and techniques could also be applied to servo systems to minimize track misregistration for both MR and inductive heads.

Through utilization of the apparatus and method of the present invention, a method and apparatus for determining instability and write-induced magnetic center shifts for a read head is provided. In particular, the write-induced instability of MR heads can be described by combined effects of changes in read sensitivity and magnetic read center shifts for the MR heads. These two effects can be characterized by a correlation analysis. Instabilities of the head resulting purely from changes in the read sensitivity of the MR head bring about a unity of the coefficient. Instabilities of the head resulting purely from shifts of the magnetic read center of the MR head bring about a negative unity of the coefficient.

The present invention also provides a technique for determining instability based on the magnetic read center shifts and read sensitivity changes in unstable heads. The present invention facilitates reduction of track misregistration caused by write-induced magnetic center shift, as well as the classification and qualification of read heads. In addition, the present invention also facilitates improvement of the read head design, thereby improving the read throughput performance and consequently, increased product yields.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for characterizing a head in a hard drive assembly, said head having a write element, comprising:
    (a) providing a disk attached to a hard disk drive assembly, said disk having a plurality of tracks each having a track centerline, one of said tracks having a plurality of sectors, one of said sectors having a servo field with an A burst, a B burst and a C burst, where the A burst and the C burst have a common boundary located at a track centerline and where B burst has a center that is positioned along the track centerline, each sector also having a data field;
    (b) aligning the read element with the B servo burst;
    (c) writing in a data field of a first sector of one of said tracks;
    (d) reading an A burst and a C burst located in a following sector of said one of said tracks to provide an A burst amplitude value and a C burst amplitude value; and
    (e) determining a characteristic of said read element based on said A burst amplitude value and said C burst amplitude value.

2. The method as recited in claim 1, further comprising:
    (d.1) repeating (c) and (d) for a predetermined number of times to obtain a set of A burst amplitude values and a set of C burst amplitude values, prior to (e).

3. The method as recited in claim 2, wherein (d.1) comprises:
    (d.1.1) calculating cross-correlation of said set of A burst amplitude value and said set of C burst amplitude value; and
    (d.1.2) calculating a coefficient of variance of said set of A burst amplitude values;
    (d.1.3) calculating a coefficient of variance of said set of C burst amplitude value; and
    (d.1.4) determining a value representing said characteristic of said read element based on said cross-correlation, said coefficient of variance of said set of A burst amplitude values and said coefficient of variance of said set of C burst amplitude value.

4. The method as recited in claim 2, wherein in (e), said characteristic represents an instability said read element, a value of said instability being based on said set of A burst amplitude values and said set of C burst amplitude values.

5. The method as recited in claim 4, further comprising:
    (f) determining that the instability of said read element one is based solely on the read sensitivity change if the cross-correlation of said A burst amplitude values and said C burst amplitude values is positive unity.

6. The method as recited in claim 4, further comprising:
    (f) determining that the instability of said read element is based solely on the shift of the read center if the cross-correlation of said A burst amplitude value and said C burst amplitude value is negative unity.

7. The method as recited in claim 4, further comprising:
    (f) determining that the value of the instability of said read element is based solely on the read sensitivity change if said value is zero.

8. The method as recited in claim 4, further comprising the step of:
    (g) determining that the value of said instability of said read element is based solely on the shift of the read center if said value is a maximum value.

9. The method as recited in claim 2, wherein in (d.1), said predetermined number of times is 100.

* * * * *